United States Patent
Higashino et al.

(10) Patent No.: US 10,804,443 B2
(45) Date of Patent: Oct. 13, 2020

(54) LIGHT-EMITTING DEVICE

(71) Applicant: STANLEY ELECTRIC CO., LTD., Tokyo (JP)

(72) Inventors: Jiro Higashino, Tokyo (JP); Satoshi Hirama, Tokyo (JP); Sho Nozawa, Tokyo (JP); Hiroyuki Ishiko, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/206,883

(22) Filed: Nov. 30, 2018

(65) Prior Publication Data
US 2019/0172984 A1 Jun. 6, 2019

(30) Foreign Application Priority Data
Dec. 1, 2017 (JP) .................... 2017-231601

(51) Int. Cl.
 H01L 33/50 (2010.01)
 H01L 33/62 (2010.01)
 H01L 25/075 (2006.01)
(52) U.S. Cl.
 CPC ........ *H01L 33/505* (2013.01); *H01L 25/0753* (2013.01); *H01L 33/50* (2013.01); *H01L 33/62* (2013.01); *H01L 2933/0041* (2013.01)
(58) Field of Classification Search
 CPC ............... H01L 25/0753; H01L 23/544; H01L 2223/544–54493; H01L 27/15–156; H01L 2224/47; H01L 33/50
 See application file for complete search history.

(56) References Cited

U.S. PATENT DOCUMENTS

| | | | |
|---|---|---|---|
| 2009/0191407 A1* | 7/2009 | Lewarchik | C08K 3/08 428/339 |
| 2015/0016109 A1* | 1/2015 | Ogata | H01L 23/5228 362/249.02 |
| 2015/0263254 A1* | 9/2015 | Miyoshi | H01L 33/505 257/98 |
| 2016/0126224 A1* | 5/2016 | Lee | H01L 33/38 257/89 |

FOREIGN PATENT DOCUMENTS

| | | |
|---|---|---|
| EP | 2216834 A1 | 8/2010 |
| JP | 2016066680 A | 4/2016 |
| WO | 2010123051 A1 | 10/2010 |
| WO | 2014053951 A1 | 4/2014 |

OTHER PUBLICATIONS

The extended European Search Report for the related European Patent Application No. 18209578.6 dated May 3, 2019.

* cited by examiner

*Primary Examiner* — Charles D Garber
*Assistant Examiner* — Xiaoming Liu
(74) *Attorney, Agent, or Firm* — Kenealy Vaidya LLP

(57) ABSTRACT

A light-emitting device with high luminance which has high uniformity in color and intensity can be provided. The light-emitting device includes a mounting substrate, a plurality of light-emitting elements disposed on the mounting substrate side by side, a wavelength conversion plate provided over the plurality of light-emitting elements and having a side surface, and a plurality of bumps disposed on the mounting substrate to abut against the side surface of the wavelength conversion plate, so as to determine a position of the wavelength conversion plate.

16 Claims, 7 Drawing Sheets

LIGHT-EMITTING DEVICE

This application claims the priority benefit under 35 U.S.C. § 119 of Japanese Patent Application No. 2017-231601 filed on Dec. 1, 2017, which is hereby incorporated in its entirety by reference.

TECHNICAL FIELD

The presently disclosed subject matter relates to a light-emitting device including a light-emitting element.

BACKGROUND ART

Conventionally, a light-emitting device having a light-emitting element and a wavelength converter configured to convert the wavelength of light emitted from the light-emitting element has been known. For example, Japanese Patent Application Laid Open No. 2016-066680 discloses a light-emitting device including an LED element and a wavelength conversion layer.

The light-emitting device may include, for example, a semiconductor light-emitting element such as a light-emitting diode or a semiconductor laser as the light-emitting element. Further, in the case of the light-emitting device used for illumination, the light-emitting device may include a phosphor plate having a wavelength converter, for example, a phosphor, which can convert a wavelength from a light-emitting element to generate white light as illumination light. For example, the wavelength converter can receive light emitted from the light-emitting element and convert the wavelength of part of the light. The wavelength converter can generate outgoing light, for example, illumination light, which is output to the outside by mixing the wavelength-converted light and the light emitted from the light-emitting element.

Here, it is preferable that light having small color unevenness and intensity unevenness be emitted from the wavelength converter. For example, when the wavelength converter is disposed on the light-emitting element, it is preferable that the wavelength converter has a shape and a size so as to uniformly receive light emitted from the light-emitting element, and that the wavelength converter is securely fixed at a preferable position on the light-emitting element.

SUMMARY

The presently disclosed subject matter was devised in view of these and other problems and features in association with the conventional art. According to an aspect of the presently disclosed subject matter, a light-emitting device with high luminance in which a wavelength converter is securely fixed to a desired position on a light-emitting element and which has high uniformity in color and intensity can be provided.

According to another aspect of the presently disclosed subject matter, a light-emitting device can include: a mounting substrate; a plurality of light-emitting elements disposed on the mounting substrate side by side; a wavelength conversion plate provided over the plurality of light-emitting elements and having a side surface; and a plurality of bumps disposed on the mounting substrate to abut against the side surface of the wavelength conversion plate, so as to determine a position of the wavelength conversion plate.

In the light-emitting device with the above-described configuration, each of the bumps may be configured to include a bottom portion, an intermediate portion on the bottom portion, and a top portion on the intermediate portion, and the bottom portion may have a width smaller than those of the intermediate portion and the top portion. In this case, the intermediate portion of each of the bumps may have a width larger than that of the top portion, and each of the bumps may abut against the side surface of the wavelength conversion plate at the intermediate portion thereof.

Alternatively, in the light-emitting device with the above-described configuration, each of the bumps may be configured to include a first metal bump formed on the mounting substrate, and a second metal bump formed on the first metal bump and disposed on a side closer to the wavelength conversion plate than the first metal bump, and each of the bumps may abut against the side surface of the wavelength conversion plate at the second metal bump thereof.

Alternatively, in the light-emitting device with the aforementioned configuration, each of the bumps may be configured to include a first metal bump formed on the mounting substrate and having a stepped structure, and a second metal bump formed on the first metal bump and having a stepped structure and a width larger than that of the first metal bump, and each of the bumps may abut against the side surface of the wavelength conversion plate at the second metal bump thereof.

In the light-emitting device with the above-described configurations, the light-emitting elements may be arranged in a row, the bumps may be arranged in a direction in which the light-emitting elements are arranged, and the wavelength conversion plate may have a rectangular upper surface whose long side direction is the direction in which the light-emitting elements are arranged. In this configuration, the mounting substrate may include a pad terminal; each of the light-emitting elements may include a light-emitting portion disposed on a support substrate, and a pad electrode disposed on the support substrate to connect to the light-emitting portion and connected to the pad electrode of the mounting substrate by a bonding wire; the pad electrodes of the respective light-emitting elements may be aligned in the direction in which the light-emitting elements are arranged; and each of the bumps may be disposed on the pad electrode at a position closer to the light-emitting portion than the bonding wire.

Furthermore, the light-emitting device with the above-described configurations may further include: a base substrate to which the mounting substrate is fixed; a frame disposed on the base substrate to surround the mounting substrate; and a sealing portion configured to fill inside the frame to seal the light-emitting elements and expose the wavelength conversion plate.

According to still another aspect of the presently disclosed subject matter, a light-emitting device can include: a mounting substrate; a light-emitting element disposed on the mounting substrate; a wavelength conversion plate disposed on the light-emitting element and having a side surface; and a plurality of bumps disposed on the mounting substrate to abut against the side surface of the wavelength conversion plate, so as to determine a position of the wavelength conversion plate.

In the light emitting device with the above-described configuration, the side surface of the wavelength conversion plate may include side surfaces extending in mutually different directions, and the bumps may abut against the side surfaces correspondingly.

In the light emitting device with the above-described configurations, the mounting substrate may include a pad terminal; the light-emitting element may include a light-emitting portion disposed on a support substrate, and a pad electrode disposed on the support substrate to connect to the light-emitting portion and connected to the pad electrode of the mounting substrate by a bonding wire; and each of the bumps may be disposed on the support substrate at a position closer to the light-emitting portion than the bonding wire.

In the light emitting device with the above-described configuration, each of the bumps may be disposed on the support substrate in a region between the light-emitting portion and the pad electrode.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below to light-emitting devices of the presently disclosed subject matter with reference to the accompanying drawings in accordance with exemplary embodiments. In this description, the phrase "disposed/provided on" or the like phrase means to include cases where an object is directly disposed/provided on a corresponding object or indirectly disposed/provided above the corresponding object with another object interposed therebetween.

First Exemplary Embodiment

Figure 1A:
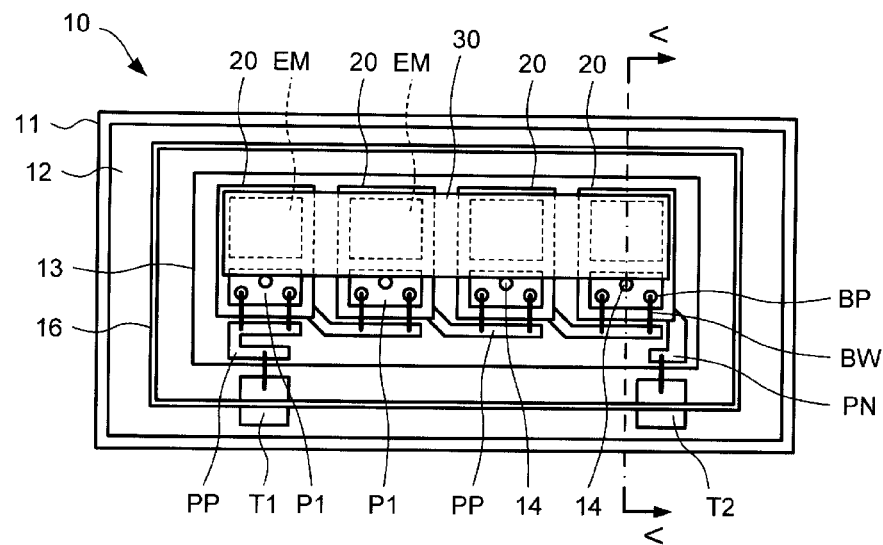
FIG. 1A is a schematic top plan view of a light-emitting device according to a first exemplary embodiment made in accordance with principles of the presently disclosed subject matter.
Figure 1B:
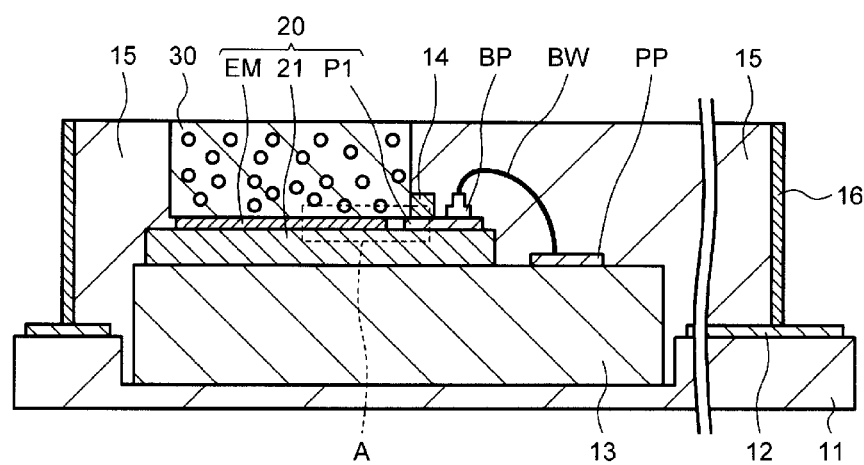
FIG. 1B is a cross-sectional view of the light-emitting device according to the first exemplary embodiment taken along line V-V in FIG. 1A.
Figure 1C:
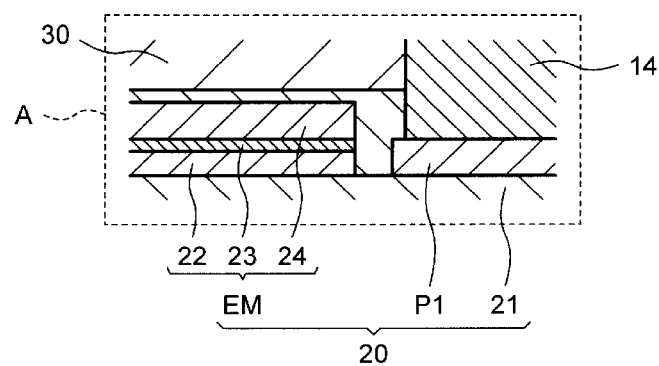
FIG. 1C is a cross-sectional view illustrating an enlarged part A surrounded by dashed line in FIG. 1B.

FIG. 1A is a schematic top plan view of a light-emitting device 10 according to a first exemplary embodiment made in accordance with the principles of the presently disclosed subject matter. FIG. 1B is a cross-sectional view of the light-emitting device 10 according to the first exemplary embodiment, taken along line V-V in FIG. 1A. FIG. 1C is a cross-sectional view illustrating an enlarged part A surrounded by dashed line in FIG. 1B. The light-emitting device 10 will next be described with reference to these drawings.

First, as shown in FIGS. 1A and 1B, the light-emitting device 10 includes a base substrate (sometimes referred to as a first substrate or a wiring substrate) 11 on which wirings (first and second wirings) T1 and T2 are formed, and a plurality of light-emitting elements 20 mounted on the base substrate 11.

In this exemplary embodiment, the light-emitting device 10 includes an insulating layer 12 formed on the base substrate 11. The insulating layer 12 has an opening for exposing the upper surface of the base substrate 11. The light-emitting device 10 includes a submount substrate 13, which may be referred to as a second substrate or a mounting substrate, fixed inside the opening of the insulating layer 12.

The light-emitting device 10 includes the plurality of light-emitting elements 20 mounted on the submount substrate 13 in a juxtaposed manner (side by side). In this exemplary embodiment, four light-emitting elements 20 are arranged in a row on the submount substrate 13. Each of the light-emitting elements 20 is connected to wirings T1 and T2 formed on the base substrate 11. The wirings T1 and T2 are connected to, for example, a connection terminal to the outside, for example, a driving circuit.

In this exemplary embodiment, the base substrate 11 may be made of a material having high thermal conductivity, for example, a metal material such as Cu. However, the base substrate 11 is not limited to the material, and may be made of, for example, an insulating material. When the base substrate 11 is made of an insulating material, the insulating layer 12 need not be provided, and the wirings T1 and T2 may be formed on the base substrate 11. The submount substrate 13 may be made of a material having high thermal conductivity, for example, ceramics.

Here, each part of the light-emitting elements 20 will be described with reference to FIG. 1C. In this exemplary embodiment, each of the light-emitting elements 20 includes a p-type semiconductor layer (first semiconductor layer) 22, an active layer 23, and an n-type semiconductor layer (second semiconductor layer) 24 stacked on a support substrate (sometimes referred to as a third substrate) 21. For example, each of the p-type semiconductor layer 22, the active layer (light-emitting layer) 23, and the n-type semiconductor layer 24 may be made of a nitride-based semiconductor.

In this exemplary embodiment, the p-type semiconductor layer 22, the active layer 23, and the n-type semiconductor layer 24 can constitute a light-emitting portion EM of the light-emitting element 20. The upper surface of the n-type semiconductor layer 24 is an upper surface of each of the light-emitting elements 20, and thus can function as a light extraction surface of each of the light-emitting elements 20.

Each of the light-emitting elements 20 is connected to the wirings T1 and T2 on the base substrate 11. In this exemplary embodiment, a p-side pad terminal (a first pad terminal) PP connected to the wiring T1 of the base substrate 11 via a bonding wire BW is formed on the submount substrate 13. In addition, on the submount substrate 13, an n-side pad terminal (second pad terminal) PN connected to the wiring T2 of the base substrate 11 via a bonding wire BW is formed.

Each of the light-emitting elements 20 has a p-side pad electrode P1 formed on the support substrate 21. A bump (connection bump) BP is formed on the p-side pad electrode P1. The p-side pad terminal PP and the bump BP are connected to each other via a bonding wire BW. In this exemplary embodiment, as shown in FIG. 1A, two bumps BP are formed on the p-side pad electrode P1 of each of the light-emitting element 20, and the p-side pad terminal PP and the bumps BP are connected by two bonding wires BW.

In this exemplary embodiment, the light-emitting elements 20 are connected to each other between the support substrate 21 and the submount substrate 13.

Referring to FIG. 1A, in this exemplary embodiment, the light-emitting portion EM in each of the light-emitting elements 20 has a rectangular upper surface shape. Further, on the submount substrate 13, the light-emitting portions EM are arranged so as to be aligned in one row, and the p-side pad electrodes P1 are arranged so as to be aligned in one row along the arrangement direction of the light-emitting portions EM.

Next, as shown in FIG. 1A, the light-emitting device 10 includes a wavelength conversion plate 30 integrally formed over the respective light-emitting elements 20. The wavelength conversion plate 30 is configured to perform wavelength conversion on the light emitted from each of the light-emitting elements 20. The wavelength conversion plate 30 may include, for example, a plate-like member including phosphor particles and a binder, or a single crystal phosphor plate. In this exemplary embodiment, the wavelength conversion plate 30 has a rectangular upper surface shape in which the arrangement direction of the light-emitting elements 20 is the long side direction.

As shown in FIG. 1B, in this exemplary embodiment, one of the main surfaces of the wavelength conversion plate 30 is bonded to the upper surfaces of the light-emitting elements 20, and the other main surface faces the outside. That is, the one main surface of the wavelength conversion plate 30 can function as a light receiving surface for the light emitted by the light-emitting elements 20, and the other main surface thereof can function as a light extraction surface of the light-emitting device 10.

The light-emitting device 10 includes bumps 14 that abut against the side surface of the wavelength conversion plate 30 to determine the position of the wavelength conversion plate 30 on each of the light-emitting elements 20. In this exemplary embodiment, as shown in FIGS. 1A and 1B, the bumps 14 may be formed of cylindrical metal bumps (metal protrusions) provided on the p-side pad electrode P1 of the support substrate 21 in each of the light-emitting elements 20. Each of the bumps 14 is arranged in a row along the arrangement direction of the light-emitting elements 20.

In other words, in this exemplary embodiment, the submount substrate 13 has the p-side pad terminals PP. Each of the light-emitting elements 20 includes the light-emitting portion EM disposed on the support substrate 21, and the p-side pad electrode P1 disposed on the support substrate 21 and connected to the light-emitting portion EM and connected to the p-side pad terminal PP of the submount substrate 13 by the bonding wire BW.

The respective p-side pad electrodes P1 of the light-emitting elements 20 are aligned along the arrangement direction of the light-emitting element 20, and each of the bumps 14 is disposed on the p-side pad electrode P1 at a position closer to the light-emitting portion EM than the bonding wire BW.

Since the light-emitting device 10 has the bumps 14, the position of the wavelength conversion plate 30 on the light-emitting elements 20 can be reliably determined. Accordingly, even when the wavelength conversion plate 30 is formed in a shape and size that substantially covers only the upper surfaces of the light-emitting portions EM, the high positioning accuracy allows the plate to be disposed without displacement.

If the bump 14 is not provided, the wavelength conversion plate may need to be prepared in a shape and size such that the wavelength conversion plate certainly covers the light-emitting portions EM, for example, not only the light-emitting portions EM but also the entire light-emitting elements 20.

More specifically, when a wavelength conversion plate having a shape and size adapted only to the light-emitting portions EM on the light-emitting elements 20 is disposed without using the bump 14, the upper surface of the light-emitting elements 20 may be partially exposed when viewed from the wavelength conversion plate side. In this case, there is a possibility that remarkable color unevenness will occur by emitting a large amount light whose wavelength is not converted from the exposed portion. When this issue is considered, a wavelength conversion plate having a relatively large size may have to be prepared.

Further, as a result of making the shape and size of the wavelength conversion plate sufficiently larger than the light-emitting portions EM, a region in which the light from the light-emitting portions EM does not directly enter, such as a region on the p-side pad electrode P1, is formed in the wavelength conversion plate. This causes unevenness in the intensity of light incident on the wavelength conversion plate, resulting in wavelength conversion unevenness, i.e., color unevenness.

However, in this exemplary embodiment, it is possible to accurately position the wavelength conversion plate 30 by the bumps 14. Therefore, even if the wavelength conversion plate 30 is relatively small corresponding only to the light-emitting portions EM, the wavelength conversion plate 30 can be reliably fixed on the light-emitting elements 20. Therefore, the wavelength conversion plate 30 may be prepared in a necessary shape and size without waste. Therefore, the light emitted from the light-emitting element 20 is received over almost the entire surface of the wavelength conversion plate 30, and the light is extracted with a uniform color and intensity. In addition, the wavelength conversion plate 30 is miniaturized, resulting in a compact light-emitting device 10.

In this exemplary embodiment, the bumps BP and the bonding wires BW for connection to the outside (in this exemplary embodiment, the p-side pad terminals PP on the submount substrate 13) are formed on the p-side pad electrode P1. As shown in FIGS. 1A and 1B, the bumps 14 are provided on the p-side pad electrodes P1 at respective positions closer to the wavelength conversion plate 30 than the bumps BP and the bonding wires BW. As a result, the wavelength conversion plate 30 is prevented from being brought into contact with the bonding wires BW, and damage to the bonding wires BW and connection failure resulting therefrom are prevented.

In addition, as shown in FIG. 1B, in this exemplary embodiment, the light-emitting device 10 includes a sealing portion 15 configured to seal the respective light-emitting elements 20 and the components, including the bonding wires BW and the p-side pad terminals PP and PN, on the submount substrate 13 and expose the upper surface of the wavelength conversion plate 30. The sealing portion 15 may be made of a resin material, for example, a resin material having reflectivity with respect to light emitted from the light-emitting element 20 and the wavelength conversion plate 30. For example, the sealing portion 15 may be made of a white resin. Note that illustration of the sealing portion 15 is omitted in FIG. 1A.

In this exemplary embodiment, a frame 16 is formed on the base substrate 11 to define a sealing region of the sealing portion 15. The frame 16 is annularly formed on the base substrate 11 so as to surround the entire region of the light-emitting elements 20 and the submount substrate 13. The frame 16 is made of a material such as ceramics, for example. The sealing portion 15 is formed to fill a region surrounded by the frame 16 on the base substrate 11.

In other words, in this exemplary embodiment, the light-emitting device 10 includes the base substrate 11 to which the submount substrate 13 is fixed, the frame 16 disposed on the base substrate 11 so as to surround the submount substrate 13, and the sealing portion 15 filled in the frame 16 to seal each of the light-emitting elements 20 and expose the wavelength conversion plate 30.

By providing the frame 16 on the base substrate 11, the position of the wavelength conversion plate 30 can be determined more reliably. For example, the sealing portion 15 can be formed by pouring a thermosetting resin into the frame 16 and then heating and curing the resin. By the thermosetting resin remaining in the frame 16, unintended displacement of the wavelength conversion plate 30 is prevented, and the state in which the wavelength conversion plate 30 is reliably positioned is maintained even after the product is completed.

In addition, as in the light-emitting device 10, since the light-emitting elements 20 are arranged in one row and the wavelength conversion plate 30 has a rectangular upper surface shape in which the arrangement direction of the light-emitting elements 20 is a long side direction, a line-shaped light distribution having high uniformity in color and intensity can be formed. For example, such a light-emitting device 10 is suitable as a lamp for a vehicle.

In this exemplary embodiment, the light-emitting device 10 has the base substrate 11 and the submount substrate 13, and the light-emitting elements 20 are mounted on the submount substrate 13. However, the light-emitting device 10 may not include the base substrate 11.

The structure of the light-emitting element 20 described above is merely an example. For example, the light-emitting element 20 may have a structure in which the n-type semiconductor layer 24, the active layer 23, and the p-type semiconductor layer 22 are stacked on a growth substrate, and the growth substrate is mounted on the base substrate 11 or the submount substrate 13. In addition, the light-emitting element 20 may not have the p-side pad electrode P1, but may be connected to the wiring T1 by another connection means.

In this exemplary embodiment, a case where the bump 14 is formed of a cylindrical metal bump formed on the p-side pad electrode P1 has been described, but the configuration of the bump 14 is only an example. For example, the bump 14 may be made of a resin material, and may have a prism shape, a pyramid shape, or other appropriate shapes.

In this exemplary embodiment, a case where the bump 14 is provided on each of the light-emitting elements 20 has been described, but the bump 14 may not be provided on each (all) of the light-emitting elements 20. For example, the bumps 14 may be provided on the p-side pad electrodes P1 of any two of the four light-emitting elements 20.

In this exemplary embodiment, a case where the light-emitting device 10 has the sealing portion 15 and the frame 16 has been described, but the light-emitting device 10 may not have the sealing portion 15 and the frame 16.

As described above, in this exemplary embodiment, the light-emitting device 10 includes the plurality of light-emitting elements 20 formed on the submount substrate (mounting substrate) 13, the wavelength conversion plate 30 formed over the plurality of light-emitting elements 20, and the bumps 14 configured to abut against the side surface of the wavelength conversion plate 30 to determine the position of the wavelength conversion plate 30 on the light-emitting element 20. Accordingly, the wavelength conversion plate 30 can be securely fixed to a desired position on the light-emitting element 20, and the light-emitting device 10 with high luminance and high uniformity in color and intensity can be provided.

Second Exemplary Embodiment

Figure 2A:
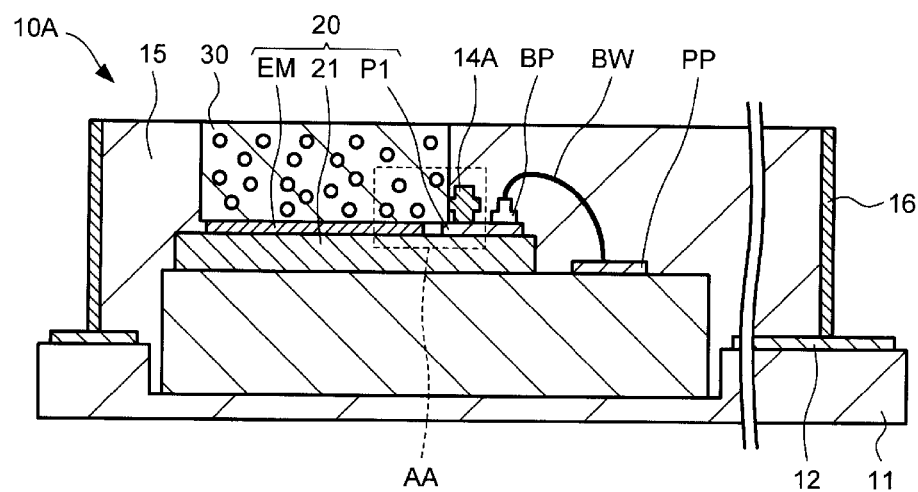
FIG. 2A is a cross-sectional view of a light-emitting device according to a second exemplary embodiment.
Figure 2B:
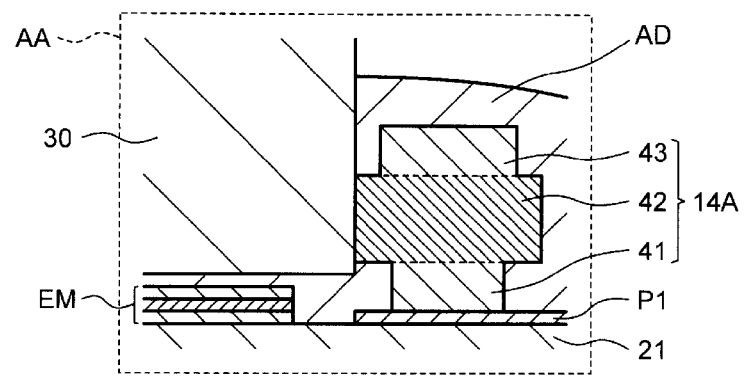
FIG. 2B is an enlarged cross-sectional view illustrating a part AA surrounded by a dashed line in FIG. 2A.

FIG. 2A is a cross-sectional view of a light-emitting device 10A according to a second exemplary embodiment. FIG. 2B is an enlarged cross-sectional view illustrating a part AA surrounded by a dashed line in FIG. 2A. The light-emitting device 10A will be described in detail with reference to FIGS. 2A and 2B. The light-emitting device 10A has the same configuration as that of the light-emitting device 10 except for the configuration of a bump 14A.

In this exemplary embodiment, as illustrated in FIG. 2B, the bump 14A is configured to include a bottom portion 41, an intermediate portion 42, and a top portion 43, and be formed on the p-side pad electrode P1 as a metal bump having a substantially cylindrical shape as a whole. The intermediate portion 42 of the bump 14A has a width larger than those of the bottom portion 41 and the top portion 43 in the direction parallel to the submount substrate 13, i.e., a diameter in this exemplary embodiment. In the light-emitting device 10A, the side surface of the wavelength conversion plate 30 abuts against the side surface of the intermediate portion 42 of the bump 14A.

Also, as shown in FIG. 2B, the wavelength conversion plate 30 is bonded to the surface of the light-emitting portion EM (n-type semiconductor layer 24) by an adhesive AD while a portion of its side is abutting against the bump 14A. In addition, in this exemplary embodiment, part of the adhesive AD is disposed on the support substrate 21 so as to be in contact with a lower part of the side surface of the wavelength conversion plate 30 and embed the bump 14A. Although not clearly shown in these drawings, the sealing portion 15 seals the light-emitting elements 20, the bonding wires BW, and the like while being in contact with the upper surface of the adhesive AD.

Figure 3A:
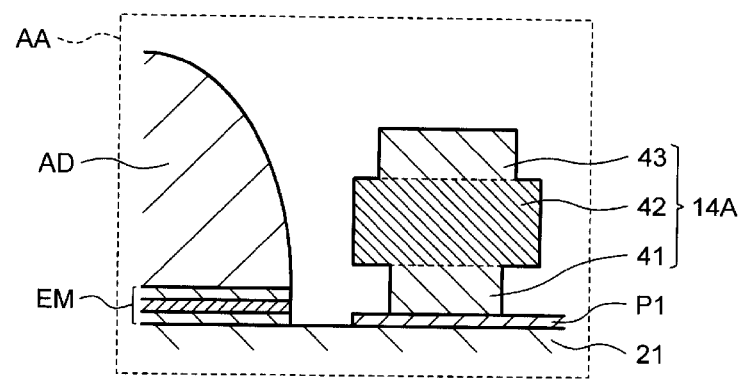
FIG. 3A is a diagram illustrating a production process of the light-emitting device according to the second exemplary embodiment.
Figure 3B:
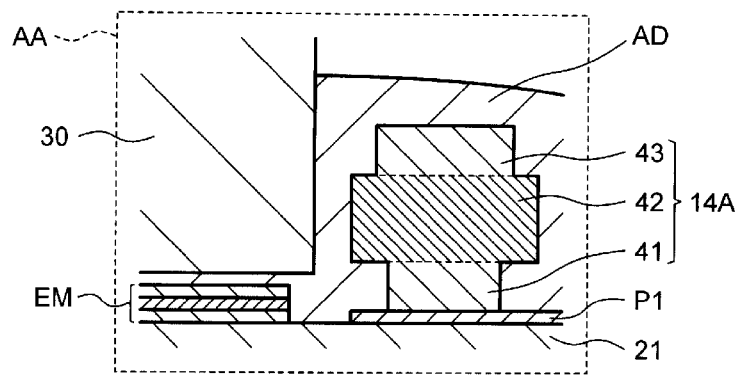
FIG. 3B is a diagram illustrating the production process of the light-emitting device according to the second exemplary embodiment.
Figure 3C:
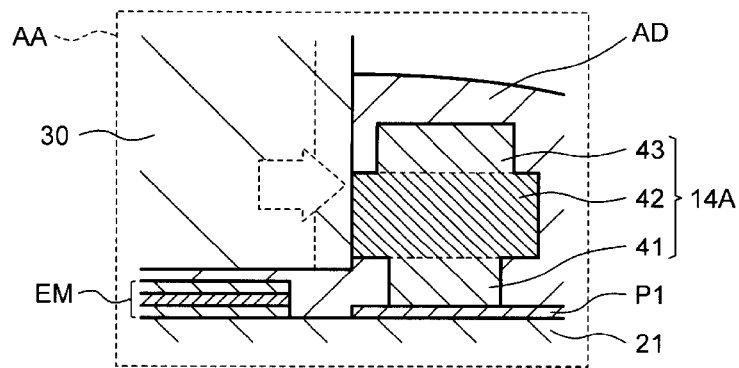
FIG. 3C is a diagram illustrating the production process of the light-emitting device according to the second exemplary embodiment.

Next, with reference to FIGS. 3A to 3C, a production process of the light-emitting device 10A, in particular, a forming step of the bump 14A and a bonding step of the wavelength conversion plate 30 to the light-emitting element 20 will be described. Each of FIGS. 3A to 3C is a cross-sectional view showing a part AA surrounded by a dashed line in FIG. 2A in the production process of the light-emitting device 10A.

First, a step of forming the bump 14A (step A) will be described with reference to FIG. 3A. In this exemplary embodiment, the bump 14A is a metal bump made of Au. The bump 14A can be formed by using a bonding apparatus, for example, after a step of mounting the light-emitting element 20 on the submount substrate 14, and during a step of connecting the p-side pad terminal PP on the submount substrate 13 and the p-side pad electrode P1 on the support substrate 21 by wire bonding.

For example, the bump 14A can be formed by stacking two Au bumps on a side closer to the light-emitting portion EM than the connection bump BP on the p-side pad electrode P1 when the connection bump BP, such as in FIG. 1A, is formed. The bump 14A can be stably formed by reducing the bump size in the first stage of the two-stage bump formation and increasing the bump size in the second stage. Further, by shifting the second-stage bump closer to the light-emitting portion EM than the first-stage bump, the bump 14A can be stably formed.

Next, an adhesive AD is applied onto the light-emitting portion EM (step B). In this exemplary embodiment, as the adhesive AD, a viscous thermosetting resin is applied onto the surface of the n-type semiconductor layer 24. At this time, as shown in FIG. 3A, the adhesive AD is preferably disposed only on the light-emitting portion EM.

Next, FIG. 3B is a diagram illustrating a state in which the wavelength conversion plate 30 is provisionally disposed on the light-emitting element 20. The wavelength conversion plate 30 is disposed on the light-emitting portion EM by using a conveying device, and is pressed against the adhesive AD (step C). As a result, the adhesive AD is brought into contact with the entire bottom surface of the wavelength conversion plate 30, so that the wavelength conversion plate 30 is provisionally positioned on the light-emitting portion EM. At this time, the adhesive AD overflows from the light-emitting portion EM toward the bump 14A on the support substrate 21. In this exemplary embodiment, the entire bump 14A is thus embedded in the adhesive AD.

Next, FIG. 3C is a view illustrating a state in which the wavelength conversion plate 30 is made abut against the bump 14A to be fixed. After the aforementioned step C, the wavelength conversion plate 30 is moved to the bump 14A in a self-aligned manner to abut against the bump 14A, thereby being positioned (step D). Specifically, the wavelength conversion plate 30 is disposed on the adhesive AD, so that the adhesive AD overflows toward the bump 14A, whereby the wavelength conversion plate 30 is gradually moved (displaced) toward the bump 14A. As a result, the side surface of the wavelength conversion plate 30 can abut against the bump 14A, so that the position of the wavelength conversion plate 30 is determined.

Here, in this exemplary embodiment, only the side surface of the intermediate portion 42 of the bump 14A can abut against (be brought into contact with) the wavelength conversion plate 30. Therefore, the side surfaces of the bottom portion 41 and the top portion 43 of the bump 14A are not in contact with the wavelength conversion plate 30. By forming the bump 14A with this configuration in this manner, the wavelength conversion plate 30 can stably abut against the bump 14A, so that the position thereof is reliably determined.

Specifically, first, since the bottom portion 41 of the bump 14A has a width smaller than that of the intermediate portion 42, the adhesive AD stably moves toward the region between the wavelength conversion plate 30 and the bottom portion 41 of the bump 14A when the wavelength conversion plate 30 is displaced. That is, the bottom portion 41 ensures the escape of the adhesive AD (moving path for the adhesive AD). Therefore, the intermediate portion 42 and the wavelength conversion plate 30 reliably abut against each other.

Similarly, since the intermediate portion 42 of the bump 14A has a width larger than that of the top portion 43, it is possible to secure the escape of the adhesive AD in the case where the adhesive AD is applied in an amount to bury the bump 14A as in this exemplary embodiment, for example. Therefore, since the bump 14A has the intermediate portion 42, and the bottom portion 41 and the top portion 43 having a smaller width than that of the intermediate portion 42, the wavelength conversion plate 30 surely abuts against the bump 14A, so that the position of the wavelength conversion plate 30 is surely determined.

In this exemplary embodiment, a case where the bump 14A is composed of the bottom portion 41, the intermediate portion 42, and the top portion 43, and the bottom portion 41 and the top portion 43 each have a width smaller than that of the intermediate portion 42 has been described, but the configuration of the bump 14A is not limited to this aspect as long as the bump 14A has the bottom portion 41 with a width smaller than those of the intermediate portion 42 and the top portion 43. For example, the top portion 43 of the bump 14A may have a width larger than that of the intermediate portion 42, and the top portion 43 may abut against the wavelength conversion plate 30.

Thus, in this exemplary embodiment, the bump 14A has the bottom portion 41, the intermediate portion 42 provided on the bottom portion 41, and the top portion 43 provided on the intermediate portion 42, and the bottom portion 41 has a smaller width than the intermediate portion 42 and the top portion 43. Therefore, the wavelength conversion plate 30 can be securely fixed to a desired position on the light-emitting element 20, and thereby the light-emitting device 10A with high luminance and high uniformity in color and intensity can be provided.

Third Exemplary Embodiment

Figure 4A:
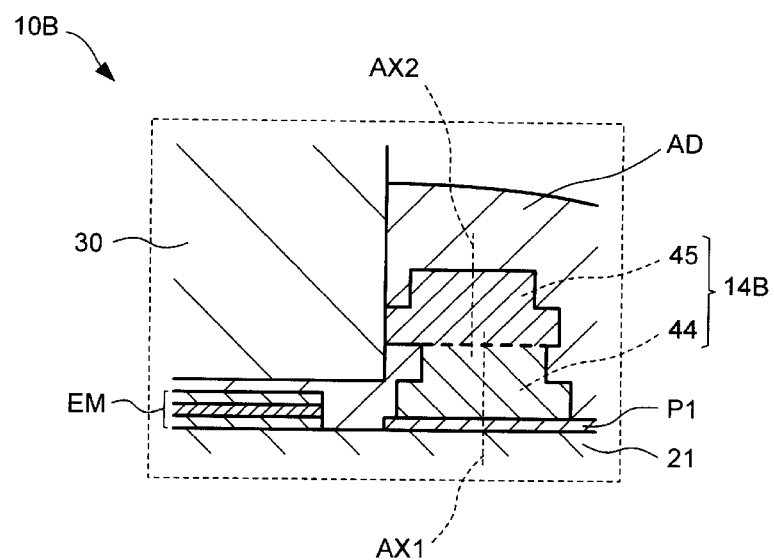
FIG. 4A is a cross-sectional view illustrating an enlarged part of a light-emitting device according to a third exemplary embodiment.

FIG. 4A is an enlarged cross-sectional view illustrating the vicinity of a bump 14B in a light-emitting device 10B according to a third exemplary embodiment in an enlarged manner. The light-emitting device 10B has the same configuration as that of the light-emitting device 10 except for the configuration of the bump 14B.

In this exemplary embodiment, the bump 14B is formed of a metal bump having a two-stage structure. The bump 14B is configured to include a lower bump (first metal bump) 44 formed on the p-side pad electrode P1 (mounting substrate 13) and an upper bump (second metal bump) 45 formed on the lower bump 44 on a side closer to the wavelength conversion plate 30 with respect to the lower bump 44.

In this exemplary embodiment, as shown in FIG. 4A, the lower bump 44 has a stepped cylindrical shape whose upper portion is thinner than the bottom portion. Like the lower bump 44, the upper bump 45 has a stepped cylindrical shape whose upper portion is thinner than the lower portion. The upper bump 45 is disposed such that the vertically extending central axis AX2 of the cylindrical shape thereof is located closer to the light-emitting portion EM (wavelength conversion plate 30) than the vertically extending central axis AX1 of the cylindrical shape of the lower bump 44. In this case after the formation of the upper bump 45, the entire height should be higher than the EM height.

The bump 14B can be formed, for example, by stacking two stepped Au bumps in two stages at different center positions, and corresponds to a case where the bump shape of the first stage (stepped shape) is maintained to a certain extent after stacking the Au bump in the second stage, which will be discussed later.

Therefore, in this exemplary embodiment, the bump 14B has a substantially four-stepped structure, and has a cylindrical shape in which the upper portion with the step, or the upper bump 45, is eccentric toward the light-emitting portion EM. In addition, the wavelength conversion plate 30 abuts against the side surface of the upper bump 45 (in this exemplary embodiment, the side surface on the bottom portion side (the side close to the lower bump 44) of the upper bump 45).

This exemplary embodiment corresponds to a configuration in consideration of a case where the side surface of the bump and the side surface of the wavelength conversion plate 30 do not surely abut against each other in two stages of metal bumps having the same size and the same center position. For example, in general, when a bump is to be formed in two stages, the bump in the first stage is deformed so as to slightly collapse at the time of forming the bump in the second stage. In this case, the height of the bump in the first stage is slightly reduced, and the width of the bump is slightly enlarged. Therefore, for example, when the upper bump 45 is formed with the same size and center position as the lower bump 44, the position of the side surface of the first-stage bump or the lower bump 44 is shifted toward the light-emitting portion EM and at the same time the height thereof may be formed lower. As a result, the wavelength conversion plate 30 may ride over the lower bump 44.

On the other hand, in this exemplary embodiment, the bump 14B has the upper bump 45, which is certainly higher than the light-emitting portion EM (and the adhesive AD). The upper bump 45 is also formed in an eccentric manner relative to the lower bump 44 so that its central axis AX2 is disposed on the side closer to the wavelength conversion plate 30 than the central axis AX1 of the lower bump 44. Therefore, the wavelength conversion plate 30 surely abuts against the bump 14B without riding on the bump 14B, so that the wavelength conversion plate 30 can be surely positioned and bonded.

Although a case where the bump 14B has a two-stage structure has been described in this exemplary embodiment, the configuration of the bump 14B is not limited to this. In another aspect, the bump 14B may a stacked structure of three or more layers as long as they are eccentric to each other. For example, an intermediate bump having a central axis disposed between those of the lower bump 44 and the upper bump 45 may be provided. The bump 14B is not limited to a cylindrical shape, and may have, for example, a prism shape or a cone shape.

As described above, in this exemplary embodiment, the bump 14B has the lower bump (first metal bump) 44 formed on the mounting substrate 13, and the upper bump (second metal bump) 45 disposed on the lower bump 44 on a side closer to the wavelength conversion plate 30 with respect to the lower bump 44. The bump 14B is also configured to abut against the wavelength conversion plate 30 on the side surface of the upper bump 45. Therefore, the wavelength conversion plate 30 is securely fixed to a desired position on the light-emitting element 20, so that the light-emitting device 10B having high luminance and high uniformity of color and intensity can be provided.

Fourth Exemplary Embodiment

Figure 4B:
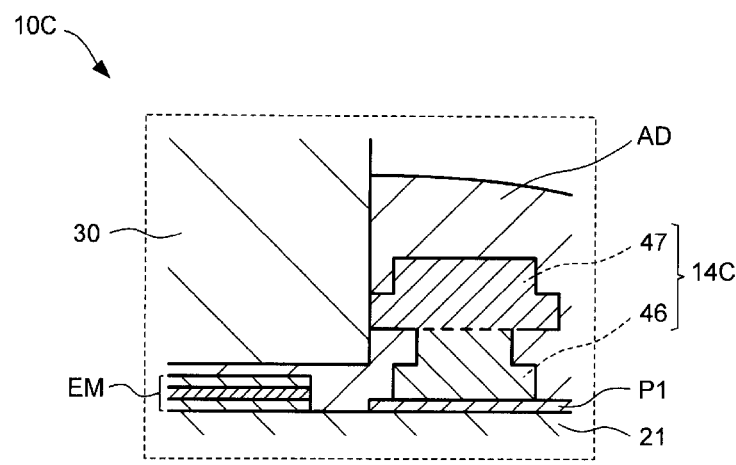
FIG. 4B is a cross-sectional view illustrating an enlarged part of a light-emitting device according to a fourth exemplary embodiment.

FIG. 4B is an enlarged cross-sectional view illustrating the vicinity of a bump 14C in a light-emitting device 10C according to a fourth exemplary embodiment in an enlarged manner. The light-emitting device 10C has the same configuration as that of the light-emitting device 10 except for the configuration of the bump 14C.

First, the bump 14C has, for example, a two-stage structure similarly to the bump 14B. On the other hand, in this exemplary embodiment, the bump 14C is configured to include a lower bump (first metal bump) 46 formed on the p-side pad electrode P1 (mounting substrate 13) and an upper bump (second metal bump) 47 formed on the lower bump 46 and having a larger width than that of the lower bump 44.

In this exemplary embodiment, as shown in FIG. 4B, the lower bump 46 has a stepped cylindrical shape in which the top portion is thinner than the bottom portion. The upper bump 47 has a stepped cylindrical shape whose upper portion is thinner than its bottom portion and whose overall width (diameter) thereof is larger than that of the lower bump 46. In this exemplary embodiment, the bump 14C can be formed, for example, by stacking two stepped Au bumps with the use amounts of Au different from each other, and corresponds to a case where the bump shape of the first stage (stepped shape) is maintained to a certain extent after stacking the Au bump in the second stage.

In this exemplary embodiment, the bump 14C has a substantially four-stage structure, and when the side close to the mounting substrate 13 is referred to as the first stage, the third stage has a cylindrical shape having the largest diameter. In this state, the wavelength conversion plate 30 abuts against the side surface of the upper bump 47 of the bump 14C (in this exemplary embodiment, the side surface on the bottom portion side (the side close to the lower bump 46) of the upper bump 47).

Similar to the bump 14B, the bump 14C is configured to include the upper bump 47 larger than the lower bump 46 in consideration of a case where the wavelength conversion plate 30 is not reliably positioned by means of a two-stage bump of the same size and center position or a case where the wavelength conversion plate 30 rides on the lower bump 46. Therefore, the wavelength conversion plate 30 can be reliably positioned.

FIG. 4B illustrates a case where the upper bump 47 is arranged on the same central axis as the lower bump 46. However, the upper bump 47 and the lower bump 46 may be arranged so that their center axes are different from each other, as shown in FIG. 4A, for example. Furthermore, the bump 14C is not limited to a cylindrical shape, and may have, for example, a prism shape or a cone shape.

As described above, in this exemplary embodiment, the bump 14C is configured to include the stepped lower bump (first metal bump) 46 formed on the mounting substrate 13, and the stepped upper bump (second metal bump) 47 formed on the lower bump 46 and having a larger width than that of the lower bump 46. The bump 14C abuts against the wavelength conversion plate 30 on the side surface of the upper bump 47. Therefore, the wavelength conversion plate 30 is securely fixed to a desired position on the light-emitting element 20, and the light-emitting device 10C having high luminance and high uniformity of color and intensity can be provided.

Figure 5A:
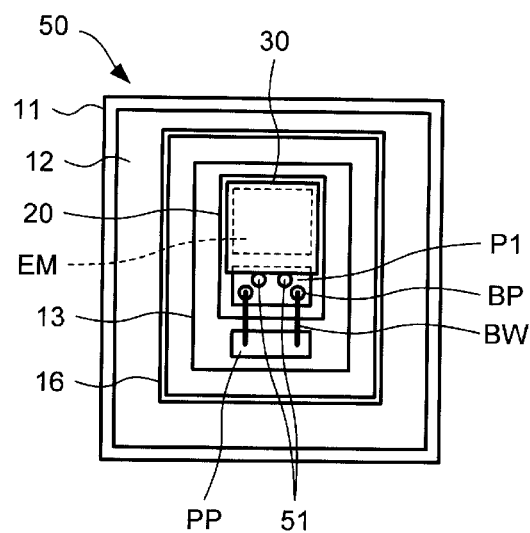
FIG. 5A is a schematic top plan view of a light-emitting device according to a fifth exemplary embodiment.

FIG. 5A is a schematic top plan view of a light-emitting device 50 according to according to a fifth exemplary embodiment. The light-emitting device 50 has the same configuration as that of the light-emitting device 10 except that it includes only one light-emitting element 20. The light-emitting device 10 includes the single light-emitting element 20 formed on the submount substrate 13, a wavelength conversion plate 30 formed on the light-emitting element 20, and a plurality of bumps 51 formed on the submount substrate 13 and configured to abut against the side surface of the wavelength conversion plate 30 to determine the position of the wavelength conversion plate 30 on the light-emitting element 20.

Like the light-emitting device 50, only one light-emitting element 20 to be mounted may be adopted. In this exemplary embodiment, two bumps 51 are provided for the single light-emitting element 20. Thus, for example, when the columnar bumps 51 are used, the position of the wavelength conversion plate 30 is reliably determined by using two or more bumps 51. As a result, the wavelength conversion plate 30 is reliably fixed to a desired position on the light-emitting element 20, and the light-emitting device 50 with high luminance and high uniformity in color and intensity can be provided.

Figure 5B:
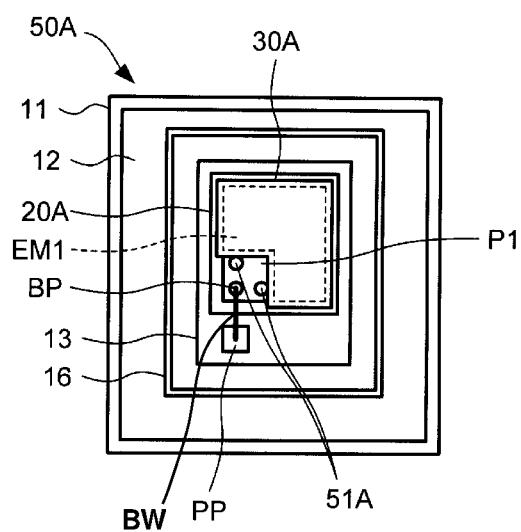
FIG. 5B is a schematic top plan view of a modified example of the light-emitting device according to the fifth exemplary embodiment.

FIG. 5B is a schematic top view of a light-emitting device 50A according to a modified example of the fifth exemplary embodiment. The light-emitting device 50A has the same configuration as that of the light-emitting device 50 except for the configuration of the light-emitting element 20A and the wavelength conversion plate 30A as well as the configuration of the bump 51A. In the present modified example, the light-emitting element 20A has a light-emitting portion EM 1 having a rectangular upper surface from which a corner is removed. The wavelength conversion plate 30A also has a rectangular upper surface shape from which a corner is removed in accordance with the upper surface shape of the light-emitting portion EM1.

The light-emitting element 20A has a rectangular p-side pad electrode P1 arranged at the removed corner. In the present modified example, one connection bump BP to which one bonding wire BW is connected is disposed on and connected to the p-side pad electrode P1.

Further, the light-emitting device 50A is configured to include two bumps 51A configured to two-dimensionally determine the position of the wavelength conversion plate 30A at the removed corner position. In the light-emitting device 50 described above, the two bumps 51 abut against one side surface of the wavelength conversion plate 30, thereby determining the position of the wavelength conversion plate 30 in the direction perpendicular to the side surface.

On the other hand, specifically in the present modified example, one of the two bumps 51A abuts against one side surface of the wavelength conversion plate 30A along one direction in a top view at the removed corner position. The other bump 51A abuts against another side surface of the wavelength conversion plate 30A along a direction different from the one direction, that is, a direction perpendicular to the one direction at the removed corner position.

Therefore, the bumps 51A can two-dimensionally determine the position of the wavelength conversion plate 30A on the light-emitting element 20A within the plane of the light-emitting portion EM. Thus, for example, when the wavelength conversion plate 30A is provisionally disposed on the adhesive, only the distance in the height direction between the wavelength conversion plate 30A and the light-emitting portion EM, i.e., the gap between the wavelength conversion plate 30A and the light-emitting element 20, needs to be accurately controlled. Therefore, the wavelength conversion plate 30A is reliably fixed to a desired position on the light-emitting element 20A, so that the light-emitting device 50A with high luminance and high uniformity of color and intensity can be provided.

Sixth Exemplary Embodiment

Figure 6A:
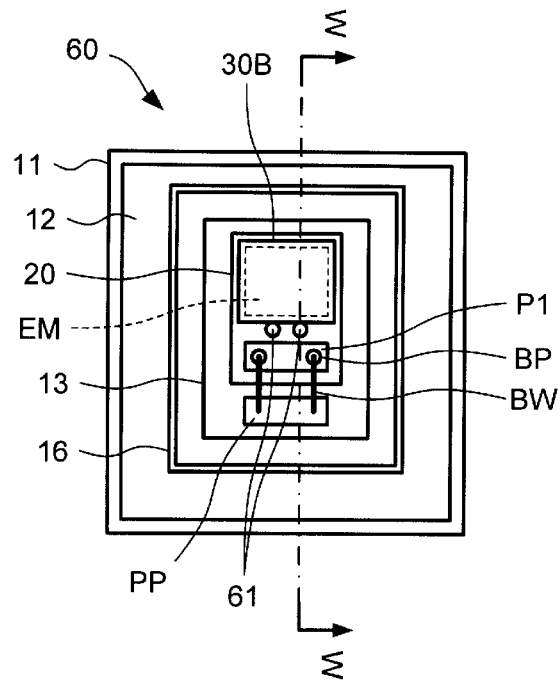
FIG. 6A is a schematic top plan view of a light-emitting device according to a sixth exemplary embodiment.
Figure 6B:
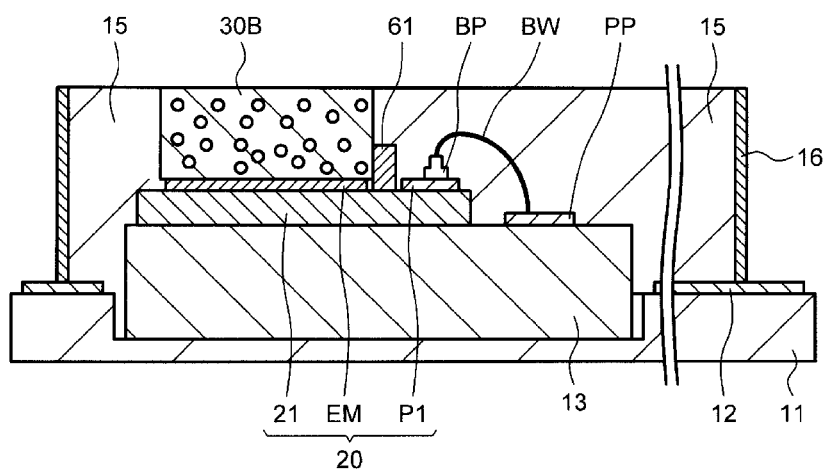
FIG. 6B is a cross-sectional view of the light-emitting device according to the sixth exemplary embodiment taken along line W-W in FIG. 6A.

FIG. 6A is a schematic top plan view of a light-emitting device 60 according to a sixth exemplary embodiment. FIG. 6B is a cross-sectional view of the light-emitting device 60 according to the sixth exemplary embodiment taken along line W-W in FIG. 6A. The light-emitting device 60 has the same configuration as that of the light-emitting device 50 except that it has bumps 61 formed in a region between the light emitting unit EM and the p-side pad electrode P1.

As shown in FIGS. 6A and 6B, in the light-emitting device 60, the bumps 61 are formed in the region between the light-emitting portion EM and the p-type pad electrode P1 on the support substrate 21. In this exemplary embodiment, the bump 61 is made of an insulating material, for example, is a resin bump made of a resin material.

For example, when the bump 51 is formed of a conductive material as in the light-emitting device 50 according to the fifth embodiment, it is preferable to dispose the bumps 51 at a certain distance in consideration of the fact that an electrical connection may be formed between the light-emitting element 20 and the bump 51. On the other hand, when the bumps 61 are formed of an insulating material, as shown in FIG. 6B, the bumps 61 can be disposed closer to the light-emitting portion EM, that is, the p-type semiconductor layer 21, the active layer 23, and the n-type semiconductor layer 24.

Therefore, as shown in FIG. 6A, the wavelength conversion plate 30B can be formed to have substantially the same size as that of the light-emitting portion EM. Therefore, it is possible to provide a high-quality light-emitting device 60 in which color unevenness and intensity unevenness are greatly suppressed.

The above-described embodiments can be selected and combined with one another. For example, the light-emitting device 10 may include the bumps 61 used in the light-emitting device 60. In another aspect, the light-emitting device 60 may include a plurality of light-emitting elements 20.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:
1. A light-emitting device comprising:
a mounting substrate;
a plurality of light-emitting elements disposed on the mounting substrate side by side;
a wavelength conversion plate provided over the plurality of light-emitting elements and having a side surface; and
a plurality of bumps disposed on the mounting substrate to abut against the side surface of the wavelength conversion plate, so as to determine a position of the wavelength conversion plate, wherein
each of the plurality of light-emitting elements includes a light-emitting portion constituted by a first semicon- ductor layer, an active layer, and a second semiconductor layer having a surface functioning as a light extraction surface,
a first pad terminal connected to the first semiconductor layer of each of the light-emitting elements and a second pad terminal connected to the second semiconductor layer of each of the light-emitting elements are formed on the mounting substrate,
the light-emitting portions are arranged in a row in a first direction,
the first pad terminals are arranged in a row in the first direction,
the plurality of bumps are arranged in the first direction to be formed on the first pad terminals,
the wavelength conversion plate has a rectangular shape, and
the plurality of bumps are in contact with the wavelength conversion plate at a plurality of corresponding positions along one side of the wavelength conversion plate.

2. The light-emitting device according to claim 1, wherein each of the bumps is configured to include a bottom portion, an intermediate portion on the bottom portion, and a top portion on the intermediate portion, and
the bottom portion has a width smaller than those of the intermediate portion and the top portion.

3. The light-emitting device according to claim 2, wherein the intermediate portion of each of the bumps has a width larger than that of the top portion, and
each of the bumps abuts against the side surface of the wavelength conversion plate at the intermediate portion thereof.

4. The light-emitting device according to claim 1, wherein each of the bumps is configured to include a first metal bump formed on the mounting substrate, and a second metal bump formed on the first metal bump and disposed on a side closer to the wavelength conversion plate than the first metal bump, and
each of the bumps abuts against the side surface of the wavelength conversion plate at the second metal bump thereof.

5. The light-emitting device according to claim 1, wherein each of the bumps is configured to include a first metal bump formed on the mounting substrate and having a stepped structure, and a second metal bump formed on the first metal bump and having a stepped structure and a width larger than that of the first metal bump, and
each of the bumps abuts against the side surface of the wavelength conversion plate at the second metal bump thereof.

6. The light-emitting device according to claim 2, wherein each of the bumps is configured to include a first metal bump formed on the mounting substrate and having a stepped structure, and a second metal bump formed on the first metal bump and having a stepped structure and a width larger than that of the first metal bump, and
each of the bumps abuts against the side surface of the wavelength conversion plate at the second metal bump thereof.

7. The light-emitting device according to claim 1, comprising:
a base substrate to which the mounting substrate is fixed;
a frame disposed on the base substrate to surround the mounting substrate; and
a sealing portion configured to fill inside the frame to seal the light-emitting elements and expose the wavelength conversion plate.

8. The light emitting device according to claim 1, wherein each of the plurality of bumps is a metal bump.

9. The light emitting device according to claim 1, wherein each of the plurality of bumps is a resin bump.

10. A light emitting device comprising:
a mounting substrate;
a light-emitting element disposed on the mounting substrate;
a wavelength conversion plate disposed on the light-emitting element and having a side surface; and
a plurality of bumps disposed on the mounting substrate to abut against the side surface of the wavelength conversion plate, so as to determine a position of the wavelength conversion plate, wherein
the light-emitting element includes a light-emitting portion constituted by a first semiconductor layer, an active layer, and a second semiconductor layer having a surface functioning as a light extraction surface,
a first pad terminal connected to the first semiconductor layer of the light-emitting element and a second pad terminal connected to the second semiconductor layer of the light-emitting element are formed on the mounting substrate, and
the plurality of bumps are columnar bumps formed on the first pad terminal.

11. The light emitting device according to claim 10, wherein
the side surface of the wavelength conversion plate includes side surfaces extending in mutually different directions, and
the bumps abut against the side surfaces correspondingly.

12. The light-emitting device according to claim 10, wherein
the mounting substrate includes a pad terminal,
the light-emitting element includes a light-emitting portion disposed on a support substrate, and a pad electrode disposed on the support substrate to connect to the light-emitting portion and connected to the pad electrode of the mounting substrate by a bonding wire, and
each of the bumps is disposed on the support substrate at a position closer to the light-emitting portion than the bonding wire.

13. The light-emitting device according to claim 11, wherein
the mounting substrate includes a pad terminal,
the light-emitting element includes a light-emitting portion disposed on a support substrate, and a pad electrode disposed on the support substrate to connect to the light-emitting portion and connected to the pad electrode of the mounting substrate by a bonding wire, and
each of the bumps is disposed on the support substrate at a position closer to the light-emitting portion than the bonding wire.

14. The light-emitting device according to claim 12, wherein
each of the bumps is disposed on the support substrate in a region between the light-emitting portion and the pad electrode.

15. The light emitting device according to claim 10, wherein each of the plurality of bumps is a metal bump.

16. The light emitting device according to claim 10, wherein each of the plurality of bumps is a resin bump.

* * * * *